US005702522A

United States Patent [19]

Sakauchi et al.

[11] Patent Number: 5,702,522
[45] Date of Patent: Dec. 30, 1997

[54] METHOD OF OPERATING A GROWING HALL CONTAINING PULLER CELLS

[75] Inventors: Kazuo Sakauchi; Yoshihiro Hirano; Akira Uchikawa, all of Vancouver, Wash.

[73] Assignee: SEH America, Inc., Vancouver, Wash.

[21] Appl. No.: 706,502

[22] Filed: Sep. 5, 1996

Related U.S. Application Data

[62] Division of Ser. No. 499,832, Jul. 10, 1995, Pat. No. 5,641,354.

[51] Int. Cl.$^6$ ........................................... F24F 3/26
[52] U.S. Cl. .................................. 117/2; 454/187
[58] Field of Search ......................... 117/1, 2; 454/187

[56] References Cited

U.S. PATENT DOCUMENTS

| | | | |
|---|---|---|---|
| 3,115,819 | 12/1963 | Mahlmeister et al. | 454/187 |
| 3,750,558 | 8/1973 | Jokiel et al. | 454/187 |
| 3,774,522 | 11/1973 | Marsh | 454/187 |
| 3,782,265 | 1/1974 | Pielkenrood et al. | 454/187 |
| 4,099,041 | 7/1978 | Berkamn et al. | 219/634 |
| 4,267,769 | 5/1981 | Davis et al. | 454/187 |
| 4,350,560 | 9/1982 | Helgeland et al. | 117/35 |
| 4,409,889 | 10/1983 | Burleson | 454/187 |
| 4,530,272 | 7/1985 | Stokes | 454/187 |
| 4,608,066 | 8/1986 | Cadwell, Jr. | 55/385.1 |
| 4,667,580 | 5/1987 | Wetzel | 454/187 |
| 4,675,144 | 6/1987 | Smith, III | 454/187 |
| 4,693,173 | 9/1987 | Saiki et al. | 454/187 |
| 4,693,175 | 9/1987 | Hashimoto | 454/187 |
| 4,723,480 | 2/1988 | Yagi et al. | 454/57 |
| 4,987,673 | 1/1991 | Kogura et al. | 29/564 |
| 5,010,777 | 4/1991 | Yehl et al. | 73/864.81 |
| 5,029,518 | 7/1991 | Austin | 454/187 |
| 5,058,491 | 10/1991 | Wiemer et al. | 454/187 |
| 5,069,113 | 12/1991 | Mattson et al. | 454/252 |
| 5,096,477 | 3/1992 | Shinoda et al. | 55/385.2 |
| 5,139,459 | 8/1992 | Takahashi et al. | 454/187 |
| 5,145,303 | 9/1992 | Clarke | 414/217 |
| 5,167,575 | 12/1992 | MacDonald | 454/187 |
| 5,181,819 | 1/1993 | Sakata et al. | 414/217 |
| 5,195,922 | 3/1993 | Genco | 454/57 |
| 5,219,464 | 6/1993 | Yamaga et al. | 55/213 |

(List continued on next page.)

FOREIGN PATENT DOCUMENTS

| | | |
|---|---|---|
| 0460477 | 5/1991 | European Pat. Off. . |
| 2194140 | 2/1986 | Japan . |
| 62-17549 | 1/1987 | Japan . |
| 2192534 | 7/1990 | Japan . |
| 4333782 | 11/1992 | Japan . |
| 4347435 | 12/1992 | Japan . |
| 5106888 | 4/1993 | Japan . |
| 5223300 | 8/1993 | Japan . |
| 5231685 | 9/1993 | Japan . |
| 5231686 | 9/1993 | Japan . |
| 5238873 | 12/1993 | Japan . |
| 9417336 | 8/1994 | WIPO . |

OTHER PUBLICATIONS

ASM/Epitasy, Inc.—Epsilon Once—Model E2—Single Wafer Epitaxial Reactor Maintenance Manual 11-322923A.Issue 2, Nov. 1990.

*Primary Examiner*—Felisa Garrett
*Attorney, Agent, or Firm*—Loeb & Loeb LLP

[57] ABSTRACT

A crystal puller cell (18) provides a low particulate environment for an individual crystal puller (28). The airflow within each cell is adjustable so that a particulate level appropriate to the activity within the cell is maintained, thereby avoiding the cost of maintaining an entire growing hall (10) at a constant high level of cleanliness. Each cell includes a multi-level floor (46) that includes an operator floor (48) and a maintenance floor (52). A door (62) at the maintenance floor level opens onto a maintenance aisle used to service the machines. A door (64), at the operator floor level, opens onto a clean aisle for transporting raw material and finished product. The cell walls can include magnetic shielding if a magnetic growing process is used to reduce exposure of operators and other machines to intense magnetic fields.

4 Claims, 5 Drawing Sheets

U.S. PATENT DOCUMENTS

| | | | |
|---|---|---|---|
| 5,223,077 | 6/1993 | Kaneko et al. | 117/34 |
| 5,253,105 | 10/1993 | Austin | 259/359 |
| 5,259,812 | 11/1993 | Kleinsek | 454/57 |
| 5,268,063 | 12/1993 | Kaneko et al. | 117/32 |
| 5,314,377 | 5/1994 | Pelosi, III | 454/187 |
| 5,316,518 | 5/1994 | Challenger | 454/187 |
| 5,322,593 | 6/1994 | Martin | 216/20 |
| 5,326,316 | 7/1994 | Hashimoto et al. | 454/187 |
| 5,344,365 | 9/1994 | Scott et al. | 454/187 |
| 5,350,336 | 9/1994 | Chen et al. | 454/187 |
| 5,385,505 | 1/1995 | Sharp et al. | 454/238 |

METHOD OF OPERATING A GROWING HALL CONTAINING PULLER CELLS

This is a division of application Ser. No. 08/499,832 filed on Jul. 10, 1995 now U.S. Pat. No. 5,641,354.

TECHNICAL FIELD

This invention relates to facilities for growing crystals for use in the semiconductor industry and, in particular, to a crystal puller cell for housing a Czochralski crystal puller and to a growing hall housing multiple ones of such cells.

BACKGROUND OF THE INVENTION

Integrated circuits are typically fabricated on wafers of a single-crystal semiconductor material. The wafers are sliced from a single crystal ingot grown in a Czochralski-type crystal growing machine, referred to as a "crystal puller." Typically, many crystal pullers are located within a single large room, called a "growing hall." A control console located by each crystal puller allows a crystal puller operator to control each crystal puller in accordance with instrument readings and observations through an observation window of conditions within the crystal puller.

To grow an ingot, a seed crystal is dipped into a crucible of molten semiconductor and then slowly retracted as the seed and the crucible are rotated in opposite directions. The semiconductor freezes onto the seed as it is retracted to produce a single crystal ingot. Crystals are sometimes grown in the presence of a strong magnetic field which, by controlling thermal convection in the molten semiconductor, produces an ingot having a more uniform amount of oxygen incorporated into the ingot from the crucible walls.

The growing process begins with loading into a crucible a "charge" of ultrapure polysilicon. A dopant is often added to the charge to change the electrical properties of the resultant crystal. A seed crystal having the desired crystal orientation is then secured within the crystal puller in a chuck attached to a cable that is used to raise the seed, and a charged crucible is loaded into the crystal puller. The section of the crystal puller in which the seed crystal and the charge are placed is called the "furnace tank." As the single-crystal ingot is grown, it is received into a "pull chamber" above the furnace tank. A "mechanical unit" below the furnace tank includes motors and other mechanical and electrical devices used in the crystal growing process.

Before melting the charge, the air in the furnace tank and pull chamber is evacuated and replaced with an inert gas, such as argon. The crucible is rotated as the charge within it is melted, typically using a resistant heater. The seed crystal is dipped slightly into the melted charge and slowly retracted to grow the ingot. After the ingot is grown and cooled, the pull chamber is opened and the ingot is removed.

Extremely small amounts of contamination in a crystal can have severe adverse effects on the characteristics of electronic circuits fabricated on the crystal. It is critical, therefore, that airborne contamination be minimized in the growing area. Although clean room techniques for reducing airborne particulate contamination are widely used in the semiconductor industry, it is difficult and expensive to maintain a high degree of cleanliness in a large growing hall. The energy cost of providing the required volume of filtered airflow is too great. Higher than optimum particulate levels have, therefore, been tolerated in growing halls, along with corresponding contamination of the grown crystals.

Cross-contamination problems are much worse during the installation of new equipment. Growing halls typically include an overhead bridge crane that is used to install new equipment and repair existing equipment. Use of such an overhead crane produces particulate contamination that settles down onto the active crystal pullers.

To reduce contamination of the crystals during the installation of new crystal pullers, one practice has been to install several machines at one time in a segregated area of the growing hall. Under these circumstances, the growing hall is not being continually contaminated and disrupted by the installation of individual machines.

SUMMARY OF THE INVENTION

An object of the present invention is, therefore, to provide a crystal-growing environment having a reduced level of airborne particulate contamination.

Another object of this invention is to provide such an environment at a reasonable cost and to achieve such an environment at a minimum running cost.

A further object of this invention is to provide such an environment capable of modular expansion.

Yet another object of this invention is to provide such an environment that is capable of reducing exposure of machine operators to magnetic fields.

Still another object of the present invention is to improve the productivity of crystal puller operators.

The present invention is an economical, low contamination environment for a crystal puller. The environment includes a crystal-puller cell for housing a crystal puller and a growing hall containing multiple crystal puller cells.

The crystal puller cell comprises plural cell walls that isolate the environment within the cell from the environment in the growing hall outside the cell and a base floor at a first level for mounting of a crystal puller. Above the base floor is a second floor for accessing the crystal puller. The second floor is preferably a multi-level floor having a second, or operator, level positioned at a height convenient for loading the raw material and unloading the single crystal and an intermediate, or maintenance, level positioned at a height between the first and second levels and convenient for maintaining the crystal puller. If a crystal puller cell houses a crystal puller using a magnetic process, the walls of the cell can be shielded to reduce exposure of workers and other equipment to the intense magnetic fields.

The crystal puller cell also includes an adjustable air contamination control system for maintaining airborne particulate within the cell below specified levels. The particulate level specified at any particular time is appropriate for the operation being performed within the crystal-growing cell. For example, the specified particulate level would be lowest, i.e., the environment within the cell would be cleanest, when the semiconductor material is exposed to the environment, i.e., when the raw material is being loaded and the single crystal is being unloaded. A higher particulate level can be tolerated when the crystal puller is operating and the furnace tank and pull chamber are closed. An even higher particulate level could be tolerated when the machine is idle. By maintaining only the level of cleanliness required, the costs associated with maintaining suitable particulate levels are greatly reduced.

The area within the growing hall is divided into three types of areas: puller cells, clean aisles, and maintenance aisles. Each area has an environment characterized by an airborne particulate level, which corresponds to a level of cleanliness. A relatively high degree of cleanliness is maintained in the clean aisles, which are used to bring raw material to and finished products from the puller cell. A lower degree of cleanliness is maintained in the maintenance aisles, which are used by maintenance workers to maintain the crystal pullers.

Each crystal puller cell has two doors: a first door, at the operator level, that opens onto a clean aisle and a second door, at the maintenance level, that opens onto a maintenance aisle. Cross contamination is prevented by logic circuitry that electronically controls the door locks to prevent both doors from being opened simultaneously and to prevent either door from opening when the environment within the puller cell is not compatible with that outside the door.

By maintaining separate environments in areas in which the semiconductor material is exposed to the environment, a low particulate level can be maintained in appropriate areas at a lower overall cost. Providing a separate environment for each crystal puller not only isolates each puller from contamination in the growing hall, it allows a reduction in airflow when appropriate in each cell, thereby further reducing costs. Moreover, additional crystal puller cells and crystal pullers can be installed with minimal contamination of existing machines.

In accordance with another aspect of the invention, a remote control console capable of controlling multiple crystal pullers is located in a clean aisle away from the doors of the puller cells. By observing instruments and video images transmitted to the remote control panel from a television camera positioned to observe conditions within the crystal puller, an operator can operate the multiple crystal pullers from one remote location, thereby reducing contamination in the immediate vicinity of the pullers, reducing operator exposure to magnetic fields, and improving productivity by allowing a single operator to operate more machines.

Additional objects and advantages of the present invention will be apparent from the following detailed description of a preferred embodiment thereof, which proceeds with reference to the accompanying drawings.

DETAILED DESCRIPTION OF PREFERRED EMBODIMENTS

Figure 1:
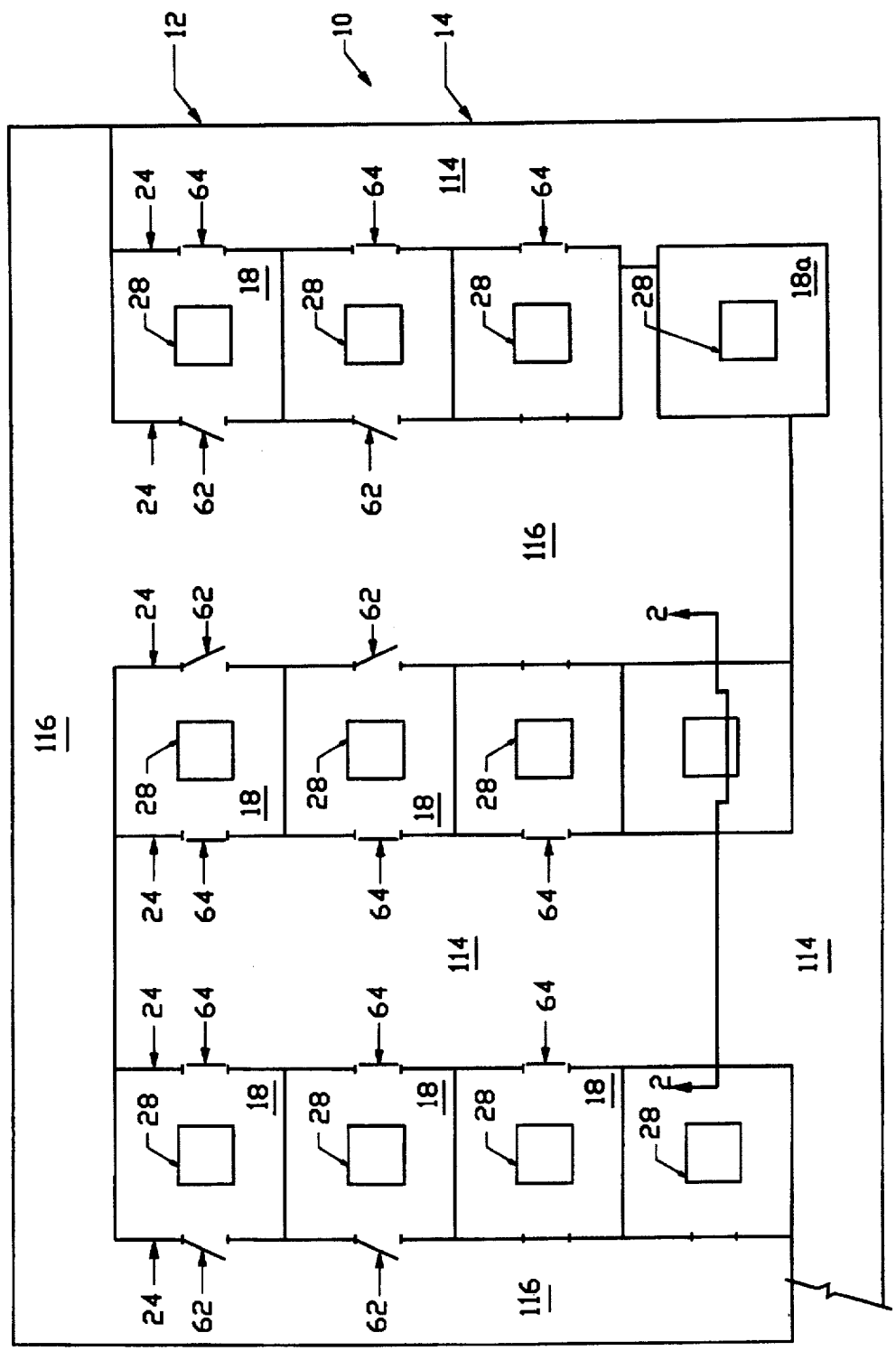
FIG. 1 is a plan view of a growing hall designed in accordance with the present invention.
Figure 2:
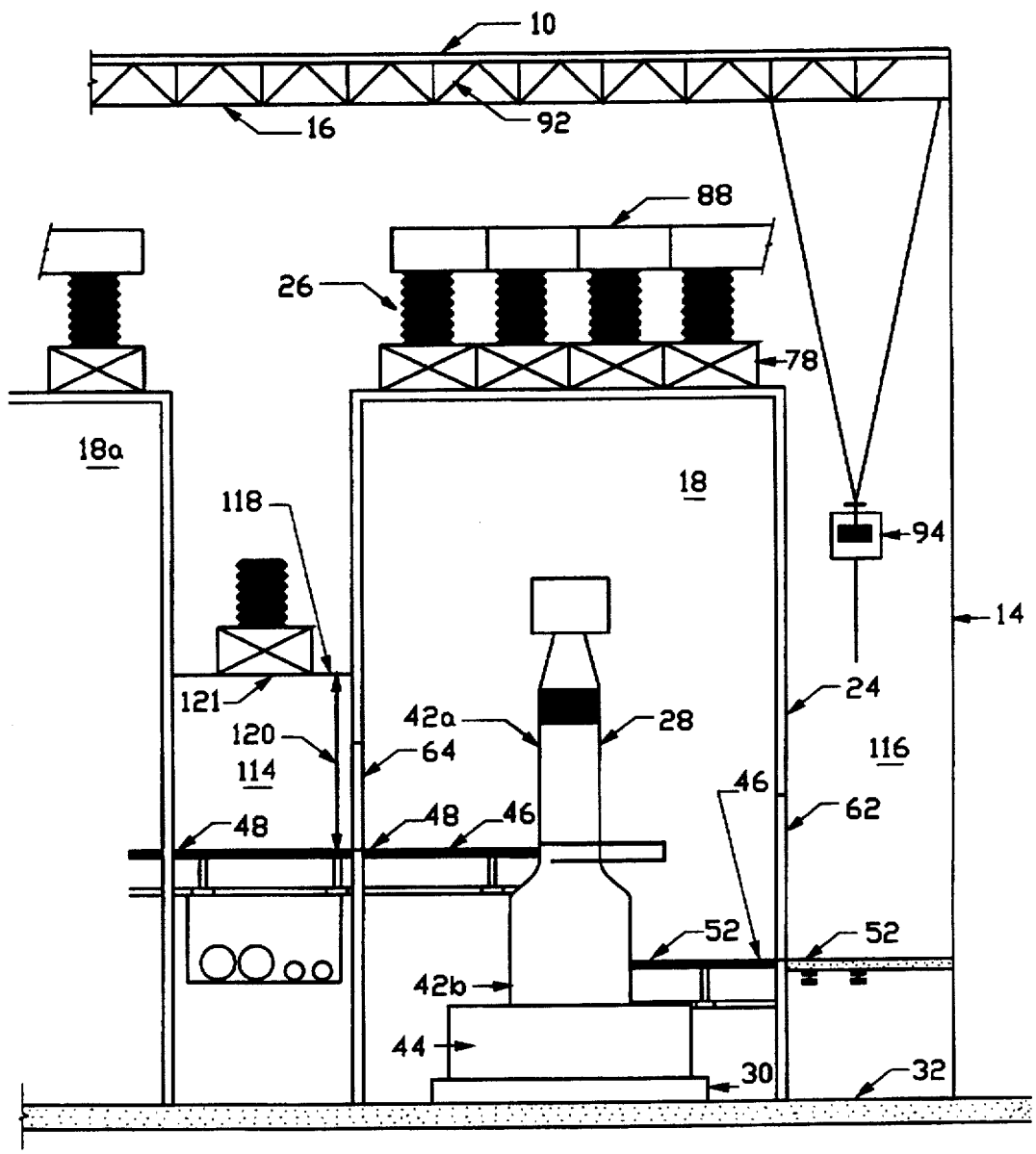
FIG. 2 is a cross sectional view of a crystal puller cell taken along line 2—2 of FIG. 1.

FIG. 1 shows the layout of a crystal-growing hall 10 of the present invention. Hall 10 is contained within a shell 12 formed from multiple walls 14 and a high ceiling 16 (FIG. 2) that provides an unobstructed, column-free expanse for containing multiple crystal puller cells 18 of the present invention. FIG. 2 shows a cross sectional view of a preferred crystal puller cell 18 of the present invention within crystal-growing hall 10. The environment within crystal puller cell 18 is isolated from the environment within hall 10 by prefabricated walls 24 and a prefabricated ceiling unit 26. Crystal puller cell 18 houses a multi-story crystal puller 28, which rests upon a prefabricated concrete pad 30, which, in turn, rests upon a base floor 32.

The use of prefabricated components to construct puller cell 18 eliminates the need for heavy construction in growing hall 10, thereby reducing sources of contamination. The use of prefabricated components also reduces the time required to construct puller cell 18.

If a magnetic process is used in crystal puller machine 28, prefabricated walls 24 can include a magnetic shielding material, such as low carbon, mild steel, or other appropriate metal alloy to prevent exposure of machine operators and other machines to intense magnetic fields. Moreover, physically separating an exemplary puller cell 18a from the other puller cells 18 can further reduce the propagation of magnetic fields from puller cell 18a through the metal walls to the other puller cells 18.

Crystal puller 28 comprises a pull chamber 42a into which the grown single crystal is received, a furnace tank 42b in which a semiconductor material is melted and grown into a single crystal, and a mechanical unit 44, positioned below furnace tank 42b, that contains mechanical and electrical components that operate crystal puller machine 28.

Puller cell 18 also includes a discontinuous multi-level floor 46 comprising an operator floor 48 positioned at an operator level convenient to pull chamber 42a and a maintenance floor 52 at a maintenance level convenient to furnace tank 42b. Operator floor 48 is typically level with the bottom of pull chamber 42a so that an operator or a material handling device (not shown) can easily access the pull chamber 42a. Such an operator floor 48 is particularly useful with crystal pullers 28 that use a door-type pull chamber 42a. It will be understood that ingots grown in crystal puller 28 can be quite large, some being longer than two meters and weighing over one hundred kilograms. Access to crystal puller 28 is provided through two doors in puller cell 18, a maintenance door 62 that opens onto the maintenance level and an operator door 64 that opens onto the operator level.

Figure 3:
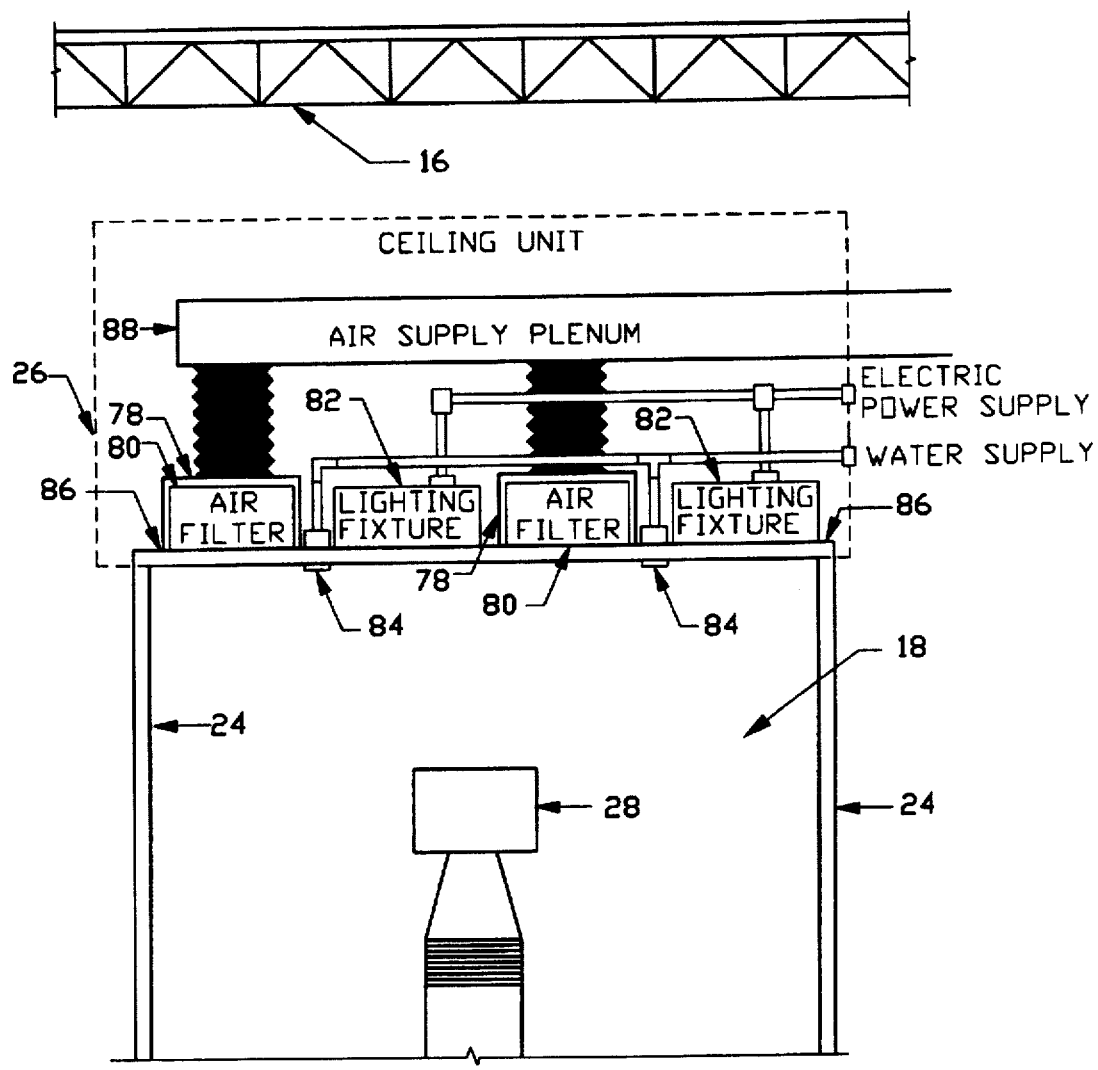
FIG. 3 shows a prefabricated ceiling unit used in the crystal puller cell of FIG. 2.

FIG. 3 shows that prefabricated ceiling unit 26 includes a filter housing 78 for housing high-efficiency particulate air ("HEPA") filters 80, lighting fixtures 82, and fire-prevention sprinklers 84 all mounted on a common ceiling grid 86. Grid 86 is mounted at the top of walls 24, above crystal pulling machine 28 and below a hall ceiling 16, and attached to a plenum 88 to provide air flow. Electric power is supplied to grid 86 to provide lighting within puller cell 18, and grid 86 is attached to a water supply for use by fire-prevention sprinklers 84. Because ceiling units 26 are prefabricated, the amount of heavy construction required in growing hall 10 is reduced. By mounting ceiling units 26 on walls 24 of an appropriate height, puller cell 18 can accommodate crystal puller machines 28 of various heights. Free ceiling 16 permits the use of walls 24 of various heights, thereby providing flexibility in constructing within a single growing hall 10 puller cells 18 that accommodate machines of different sizes, including larger machines that may be required in the future.

A bridge crane 94 is typically installed below building trusses 92 and is used in the installation and repair of crystal pullers 28 and in the construction of puller cells 18. Bridge cranes are inevitably a source of particulate contamination but, because bridge crane 94 is above ceiling unit 26, particles shed by bridge crane 94 do not contaminate the environment within crystal puller cell 18.

Figure 4:
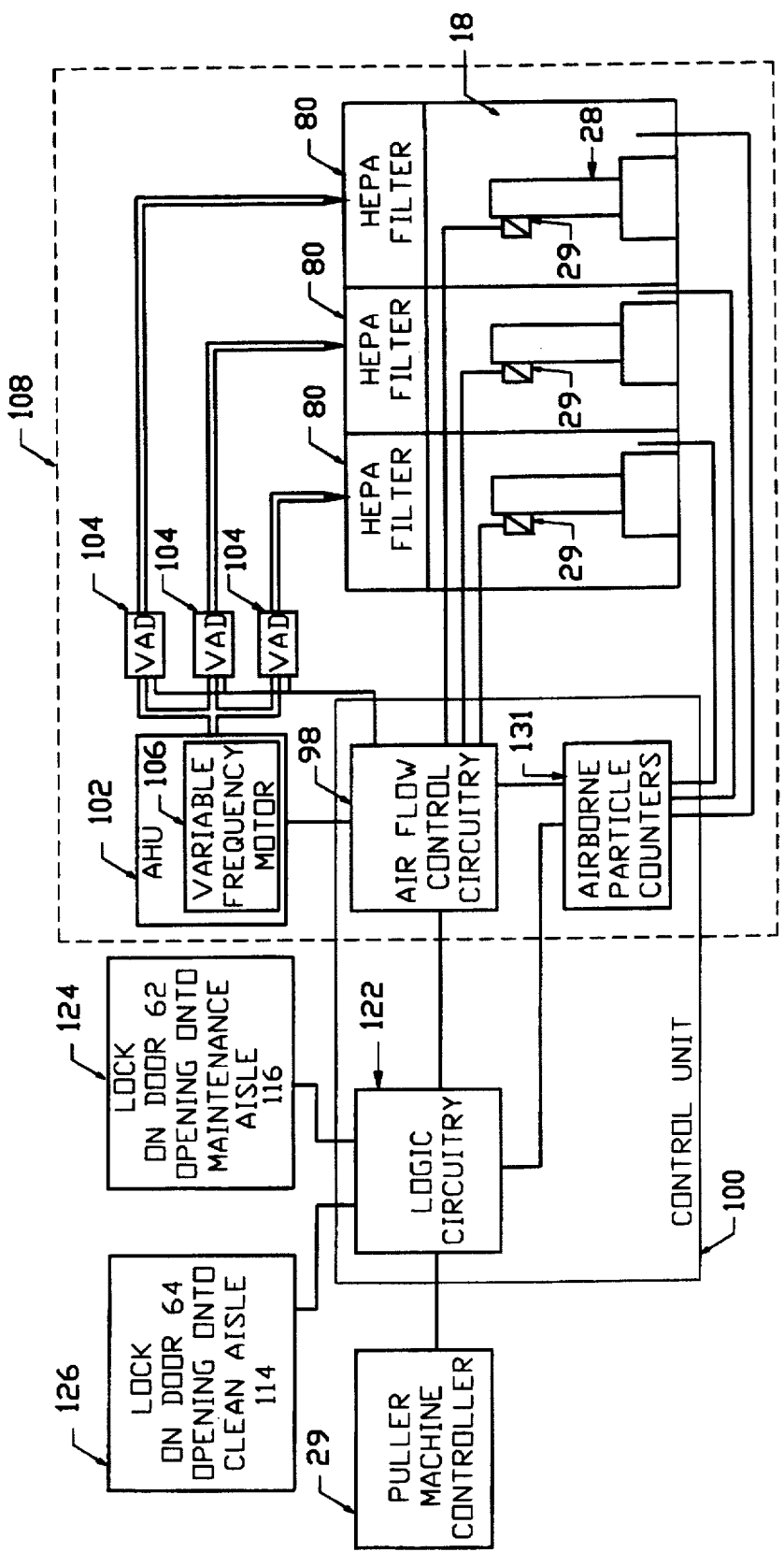
FIG. 4 is a block diagram of a control unit used to control the puller cell of FIG. 2.

Filtered air is supplied to HEPA filters 80 in ceiling unit 26 by plenum 88. The airflow within each puller cell 18 is individually controlled by airflow control circuitry 98 within a control unit 100 (FIG. 4), airflow control circuitry 98 controlling an air supply system comprising variable airflow dampers 104 and a variable frequency motor 106 in an air handler unit 102 to produce an appropriate airflow at any particular time. Airflow control circuitry 98, an air handler unit ("AHU") 102, variable air flow dampers 104, an airborne particle counter 131, and HEPA filters 80 together comprise an adjustable air contamination control system 108.

In one embodiment, a low airflow mode is used when puller cell 18 is idle or is being cleaned. A moderate airflow rate is used when crystal puller 28 is operating with the pull chamber 42a and furnace tank 42b closed. A high airflow rate is used when maximum cleanliness is required, i.e., when raw material is being loaded or a single crystal is being unloaded. A purge airflow rate, which is greater than the high airflow rate, is used to purge the interior of puller cell 18 after it has been contaminated. Each airflow operation made at each puller cell 18 is controlled by a status signal from a controller 29 of crystal puller 28 and by an airborne particle counter 131 or other device which indicates the particulate level in the puller cell.

Referring to FIG. 1, the area within growing hall 10 is divided into puller cells 18, clean aisles 114, and maintenance aisles 116. Puller dell maintenance door 62 opens onto maintenance aisle 116, and operator door 64 opens onto clean aisle 114. A relatively high degree of cleanliness is maintained in clean aisles 114, which are used to bring raw materials and finished products to and from puller cell 18. The raw material typically comprises ultrapure polycrystalline silicon, precharged in a quartz crucible; the finished product is typically a single crystal silicon ingot. A lower degree of cleanliness is maintained in maintenance aisle 116, which is used by maintenance workers to maintain crystal puller 28. To maintain their cleanliness, clean aisles 114 have clean aisle ceilings 118 (FIG. 2) at a suitable height 120 with particulate filters 121 that continuously provide filtered air to clean aisles 114. Ceiling height 120 is typically much lower than that of a prior art growing hall, so less airflow is needed to maintain the required level of cleanliness.

Control unit 100 includes logic circuitry 122 that controls locks 124 and 126 on respective doors 62 and 64 to eliminate cross contamination among puller cell 18, clean aisle 114, and maintenance aisle 116. Logic circuitry 122 prohibits opening either door when conditions within puller cell 18 do not match those outside that door. For example, if puller cell 18 is operating in a high flow mode to obtain a high degree of cleanliness or if puller cell 18 is operating in a moderate airflow mode to obtain a medium degree of cleanliness, logic circuitry 122 will prevent first door 62 from opening onto maintenance aisle 116. Similarly, if puller cell 18 is operating in a low flow mode and first door 62 is opened, logic circuitry 122 will prevent second door 64 from opening onto clean aisle 114. Logic circuitry 122 also prevents first and second doors 62 and 64 from being opened simultaneously. Furthermore, airborne particle counters 131 monitor particle level in puller cells 18. Logic circuitry 122 has a data interface with airborne particle counter 131 and prevents second door 64 from opening onto clean aisle 114 unless the particle level in puller cell 18 is compatible with that of clean aisle 114. Also, logic circuitry 122 prohibits opening either door while a magnet device in the puller cell is energized. This feature can keep operators away from areas in which a strong magnetic field is present.

Figure 5:
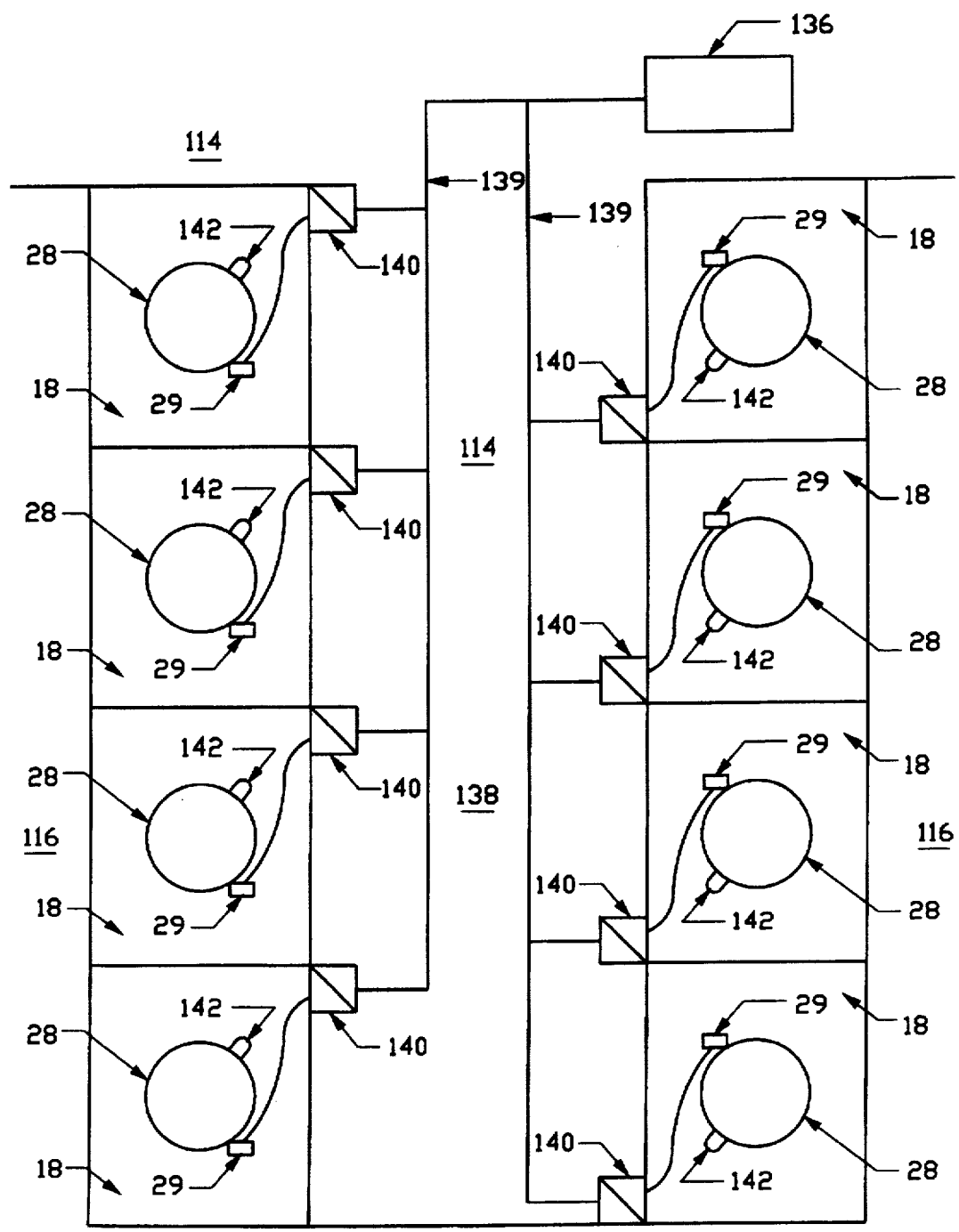
FIG. 5 is a schematic view of a remotely controlled bay including several of the crystal puller cells of FIG. 2.

FIG. 5 shows schematically a remote control console 136 for controlling several puller cells 18 within a bay 138. Remote control 136 is located in clean aisle 114 and electrically connected by conductors 139 to individual puller controller 29 through control consoles 140 positioned adjacent to each crystal puller cell 18. A television camera 142 located within each puller cell 18 transmits images of the conditions within each crystal puller 28 to an operator, who can observe the images on a video display by remote console control 136.

By allowing the operator to monitor multiple crystal pullers 28 from one location, the operator's productivity is greatly increased. By eliminating the requirement for operators to move among the crystal pullers 28 to monitor the pulling operations, much of the particulate contamination caused by the operators is eliminated. The operator is also removed from magnetic fields used in any of the puller cells 18. Because remote control console 136 is located in clean aisle 114, the operator can quickly proceed to an individual puller cell 18, when remote control console 136 indicates such a visit is required.

By individually controlling the environment surrounding each crystal puller machine 28, the present invention allows the areas in growing hall 10 to maintain appropriate cleanliness while reducing the overall facilities cost. Because smaller areas are kept clean, the cost of providing the necessary flow of filtered and conditioned air to maintain the cleanliness level is much less expensive, and those smaller areas can be maintained in a cleaner condition. Adjusting the airflow to a level appropriate to the activity with puller cell 18 further reduces costs.

Additional crystal puller machines 28 can be added while previously installed machines continue operating without contamination, thereby allowing flexibility in scheduling installation of new machines. It is more effective to invest capital in crystal pullers and puller cells only as required to meet production schedules.

It will be obvious that many changes may be made to the above-described details of the invention without departing from the underlying principles thereof. For example, a puller cell 18 could also accommodate two or more crystal pullers 28. Such an arrangement would increase operating costs, but reduce construction costs. Puller cell 18 could be divided by an internal wall into a maintenance area, defined by maintenance floor 52, and an operator area, defined by operator floor 48, with the environments of the maintenance and operator areas being separately controllable. The scope of the present invention should, therefore, be determined only by the following claims.

We claim:

1. A method of operating a growing hall to reduce clean room costs and improve cleanliness, comprising:

dividing the growing hall with walls into at least one of a clean aisle, one of a maintenance aisle, and one of a crystal puller cell;

maintaining a different airborne particulate level in the clean aisle, maintenance aisle, and the crystal puller cell respectively.

2. The method of claim 1 further comprising:

maintaining a first airborne particulate level in the maintenance aisle;

maintaining a second airborne particulate level in the clean aisle, the second airborne particulate level being lower than the first airborne particulate level; and maintaining a third airborne particulate level in the crystal puller cell, the third airborne particulate level being selected from at least two possible levels, the selection being based upon the activities within the crystal puller cell.

3. The method of claim 2 in which each crystal puller cell has a door that opens onto the maintenance aisle and a door that opens onto the clean aisle and in which maintaining the third airborne particulate level includes selectively prohibiting air transfer between the crystal puller cell and the clean and maintenance aisles, the selective prohibition of air transfer being accomplished by precluding the opening of the door between the crystal puller cell and the respective clean and maintenance aisles when the third particulate level is not compatible with the respective first and second particulate levels.

4. The method of claim 2 in which each crystal puller cell has a door that opens onto the maintenance aisle and a door that opens onto the clean aisle and in which maintaining the first and second airborne particulate levels includes prohibiting the clean and maintenance aisle by precluding the simultaneous opening of both doors to crystal puller cell.

* * * * *